(12) United States Patent
Kino et al.

(10) Patent No.: US 8,182,632 B2
(45) Date of Patent: May 22, 2012

(54) WAFER TABLE, SURFACE PROTECTIVE FILM PEELING APPARATUS AND SURFACE PROTECTIVE FILM PEELING METHOD

(75) Inventors: Hideo Kino, Mitaka (JP); Minoru Amatani, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 225 days.

(21) Appl. No.: 12/664,870

(22) PCT Filed: Jun. 17, 2008

(86) PCT No.: PCT/JP2008/061378
§ 371 (c)(1),
(2), (4) Date: Dec. 15, 2009

(87) PCT Pub. No.: WO2009/022495
PCT Pub. Date: Feb. 19, 2009

(65) Prior Publication Data
US 2010/0181019 A1  Jul. 22, 2010

(30) Foreign Application Priority Data

Aug. 14, 2007 (JP) .................................. 2007-211373
Jan. 25, 2008 (JP) .................................. 2008-014526

(51) Int. Cl.
*B32B 38/10* (2006.01)
*B32B 11/00* (2006.01)

(52) U.S. Cl. ........ 156/247; 156/289; 156/707; 156/715; 156/537; 156/759

(58) Field of Classification Search .................. 156/228, 156/247, 285, 287, 289, 701, 707, 715, 537, 156/555, 578, 580–582, 583.1, 934, 758, 156/759
See application file for complete search history.

(56) References Cited

U.S. PATENT DOCUMENTS

| 7,798,195 B2 * | 9/2010 | Kobayashi et al. ............ 156/758 |
| 2006/0011284 A1 * | 1/2006 | Ametani ......................... 156/64 |

FOREIGN PATENT DOCUMENTS

| JP | 09-181150 | 7/1997 |
| JP | 11-260892 | 9/1999 |
| JP | 2004-327587 | 11/2004 |
| JP | 2005-311176 | 11/2005 |
| JP | 10-2007-0004027 | 1/2007 |

OTHER PUBLICATIONS

International Search Report, dated Jul. 29, 2008, corresponding to PCT/JP2008/061378.
Office action cited in corresponding Korean Patent Application No. 10-2009-7027088 on Jun. 13, 2011, including English Translation, 13pp.

\* cited by examiner

*Primary Examiner* — Sing P Chan
(74) *Attorney, Agent, or Firm* — Christie, Parker & Hale, LLP.

(57) ABSTRACT

The wafer table (31) for holding a wafer (20) having the back surface thereof supported by a mount frame (36) via a dicing film (3) and the front surface thereof with a surface protective film (11) attached thereon is described. A groove (60) is formed in the area of the table corresponding to at least a part of the outer periphery of the wafer. Further, the table includes a holding means (33) for holding the wafer to the front surface of the table and a suction means for suction of the air in the groove. Thus, the dicing film can be positively collapsed in the groove while at the same time being restored to the original position.

13 Claims, 17 Drawing Sheets

WAFER TABLE, SURFACE PROTECTIVE FILM PEELING APPARATUS AND SURFACE PROTECTIVE FILM PEELING METHOD

CROSS-REFERENCE TO RELATED APPLICATION

This application is a National Phase Patent Application and claims the priority of International Application Number PCT/JP2008/061378, filed on Jun. 17, 2008, which claims priority of Japanese Patent Application Number 2007-211373, filed on Aug. 14, 2007, and Japanese Patent Application Number 2008-014526, filed on Jan. 25, 2008.

TECHNICAL FIELD

This invention relates to a wafer table used for peeling off the surface protective film attached on the wafer. Further, this invention relates to a surface protective film peeling apparatus and a surface protective film peeling method utilizing the wafer table.

BACKGROUND ART

In the semiconductor fabrication field, wafers tend to increase in size every year, and become thinner to improve package density. Generally, the surface protective tape for protecting the semiconductor element is attached on the front surface of the wafer, and then a back grinding process is conducted in which the back surface of the semiconductor wafer is ground to reduce the wafer thickness.

When the back grinding process is completed, as shown in FIG. 17, a dicing film 3 is attached on the back surface 22 of the wafer 20, so that the wafer 20 and an annular mount frame 36 can be integrated with each other.

Then, as shown in FIG. 18, the wafer 20 is held on table 131 with surface protective film 11 located above. In the process, an annular part of the adhering surface 3a of the dicing film 3 is exposed between the mount frame 36 and the wafer 20. Then, by supplying peeling tape 4 onto attaching member 146 and pressing attaching member 146 against the surface protective film 11, the peeling tape 4 is attached to the surface protective film 11. Then, table 131 for supporting the wafer 20 is moved in a horizontal direction. Since the portion where the peeling tape 4 is attached functions as a peeling start point, with the result that the surface protective film 11 can be peeled off continuously from the wafer 20 starting with the peel starting point.

As shown in FIG. 18, the forward end of the attaching member 146 is pressed against the surface protective film 11 while being placed diagonally downward with respect to the horizontal surface. However when supplying the peeling tape 4, the peeling tape 4 at the forward end 146a of the attaching member 146 may loosen and form a loop 4', thereby adhering to the adherent surface 3a (In this connection, the wafer 20 and the surface protective film 11 are actually considerably smaller in thickness than the attaching member 145).

In addition, the adherent surface of the peeling tape 4 and the adherent surface of the dicing film 3 attach to each other. The film 3 and the tape 4, once adhered to each other, are very difficult to separate without damaging the wafer 20. A similar problem may be also occur in the case where the section of the attaching member 146 is not triangular but circular, for example.

Japanese Unexamined Patent Publication No. 2005-311176 discloses that a groove extending beyond the width of the peeling tape is formed along the outer periphery of the wafer on the table. This groove is formed in a region having no holding function.

When the wafer is placed on the table and held, the air in the groove is also sucked through the gap between the dicing film and the table. While the upper part of the groove is closed by the dicing film, the air in the groove is sucked through the gap located above the groove. As a result, the internal pressure of the groove becomes negative, and the dicing film partially enteres and collapses into the groove. In such a case, even if a loop is formed by the peeling film, the loop does not reach the dicing film, and therefore, the peeling tape 4 is prevented from attaching to the dicing film.

However, in Japanese Unexamined Patent Publication No. 2005-311176, the groove does not have the holding function. Therefore, when holding the wafer, the dicing film is not necessarily collapsed in the groove and there may be a case in which the dicing film is not fully collapsed into the groove. In such a case, the loop of the peeling tape may attach to the dicing film.

Further, in Japanese Unexamined Patent Publication No. 2005-311176, cancellation of holding of the wafer causes air to flow into the groove through the gap between the dicing film 3 and the table. However since the dicing film 3 is formed of a soft material, the complete cancellation of the negative pressure of the groove is not guaranteed even after the cancellation of holding of the wafer, and the negative pressure of the groove may hamper the recovery of the mount frame. Furthermore, the dicing film may be deformed and not restored to the original position. In such a case, easily handling of the wafer is reduced in the subsequent steps.

Further, according to Japanese Unexamined Patent Publication No. 2005-311176, the side surfaces of the groove are formed substantially perpendicular to the surface of the table. The dicing film 3, collapsed in the groove, may be considerably deformed, and may not be restored to the original position. Further, the wafer, which is reduced considerably in thickness by back grinding, may be pulled and may break when the dicing film 3 is dented.

Furthermore, the die attach film (not shown), which is divided together with the wafer 20 at the time of dicing, may be attached to the dicing film 3. In such a case, the adhering strength of the dicing film 3 increases, and therefore, the possibility of the peeling tape 4 attaching to the dicing film 3 further increases.

This invention has been achieved in view of this situation, and the object thereof is to provide a wafer table and a surface protective film peeling apparatus and a surface protective film peeling method using the wafer table, in which the dicing film is positively collapsed into the groove and can be restored to the original position.

DISCLOSURE OF THE INVENTION

In order to achieve the object described above, according to a first aspect of the invention, there is provided a wafer table for holding a wafer having a back surface supported on a mount frame through a dicing film and a front surface with a surface protective film attached thereon, comprising holding means for holding the wafer to the surface of the table, a groove formed in the area of the table corresponding to at least a part of the outer periphery of the wafer and a suction means for sucking air in the groove.

Specifically, in the wafer table according to the first aspect, the suction means is associated with the groove, and therefore, the dicing film can be positively collapsed in the groove. As a result, a loop, if formed in the peeling tape, is not attached to the dicing film.

According to a second aspect of the invention, there is provided a wafer table in the first aspect, wherein the groove is formed in the area covering the entire width of the peeling tape attached to the surface protective film to peel off the surface protective film.

At the time of using the peeling tape, the two edges thereof may become attached to the dicing film. According to the second aspect, a part of the dicing film corresponding to the two edges of the peeling tape is positively collapsed in the groove, and therefore, the edges of the peeling tape are prevented from attaching to the dicing film.

According to a third aspect of the invention, there is provided a wafer table in the first aspect, wherein the groove includes a first groove formed in the area covering one transverse edge of the peeling tape attached on the surface protective film to peel off the surface protective film and a second groove formed in the area covering the other transverse edge of the peeling tape.

Specifically, in the wafer table according to the third aspect, the dicing film is not collapsed in the area between the first and second grooves, and therefore, the amount of deformation of the dicing film can be suppressed. As a result, the wafer is prevented from being pulled and broken by the extension of the dicing film.

According to a fourth aspect of the invention, there is provided a wafer table in the first aspect, wherein the groove is formed in such a manner that when the wafer is held by the holding means, the bisector of the corner portion of the circuit pattern formed on the wafer is parallel to the line segment connecting the center of the groove and the center of the wafer.

Specifically, in the wafer table according to the fourth aspect, the adhesive of the surface protective film is prevented from remaining in the two pattern grooves of the corner, and therefore, the surface protective film can be easily peeled off.

According to a fifth aspect of the invention, there is provided a wafer table in any one of the first to fourth aspects, wherein the side surfaces of the groove in a section of the groove are formed at an acute angle with respect to the surface of the table.

Specifically, in the wafer table according to the fifth aspect, the deformation amount of the dicing film can be suppressed, and therefore, the dicing film is easily restored to the original position while at the same time preventing the wafer from being pulled and broken by the dicing film.

According to a sixth aspect of the invention, there is provided a wafer table in any one of the first to fifth aspects, wherein the suction means includes at least one conduction hole extending from the groove to the holding means.

Specifically, in the wafer table according to the sixth aspect, the air in the groove can be sucked up even if the groove cannot be formed on the holding member of the table.

According to a seventh aspect of the invention, there is provided a wafer table in the first aspect, wherein the inner side portion of the groove is in the shape of an arc corresponding to at least a part of the outer periphery of the wafer and the outer side portion of the groove is linear.

Specifically, in the wafer table according to the seventh aspect, the groove can be easily formed.

According to an eighth aspect of the invention, there is provided a surface protective film peeling apparatus for peeling off the surface protective film attached to the front surface of the wafer, comprising a wafer table according to any one of the first to seventh aspects for holding the wafer with the front surface thereof up, a peeling tape supply means for supplying a peeling tape onto the surface protective film attached to the front surface of the wafer, and a press means for pressing only a part of the peeling tape against the surface protective film of the wafer thereby to increase the adhension between the peeling tape and the surface protective film at the part of the peeling tape, and a peeling means for peeling off the surface protective film from the front surface of the wafer by the peeling tape using the part of the peeling tape having the increased adherension as a peeling start point.

Specifically, in the apparatus according to the eighth aspect, the surface protective film can be peeled off from the wafer without attaching a loop of the peeling tape to the dicing film.

According to a ninth aspect of the invention, there is provided a surface protective film peeling apparatus in the eighth aspect, wherein the press means includes a press roller to move substantially transversely of the peeling tape, and wherein the part of the peeling tape is pressed by the press roller moving over the part of the peeling tape.

Specifically, in the apparatus according to the ninth aspect, the use of the press roller makes it possible to easily press only a desired part of the peeling tape by rolling the press roller. Furthermore, by reciprocating the press roller several times at the desired position, the adherension between the peeling tape and the surface protective film can be further increased.

According to a tenth aspect of the invention, there is provided a surface protective film peeling apparatus in the ninth aspect, wherein the press means includes a rotatable disk and the press roller is mounted on the lower surface of the rotatable disk in such a manner that the rotation axis of the press roller is located on the radius of the rotatable disk, and wherein the press roller is rotated along an arc on the peeling tape at the time of rotation of the rotatable disk.

Specifically, in the apparatus according to the tenth aspect, only the desired part of the peeling tape can be easily pressed by simply rotating the rotatable disk to thereby positively increase the adherence between the peeling tape and the surface protective film.

According to a 11th aspect of the invention, there is provided a surface protective film peeling apparatus in the tenth aspect, wherein an auxiliary roller is mounted on the lower surface of the rotatable disk and presses the surface protective film of the wafer located at a position other than the peeling tape.

If the single press roller arranged on the lower surface of the rotatable disk is used, the press roller may be broken under the load imposed thereon in cantilever fashion. However, according to the 11th aspect of the invention, the load is distributed by the auxiliary roller, and therefore, the load is not imposed only on the press roller. Thus the adherension between the peeling tape and the surface protective film can be improved in a very stable fashion.

According to a 12th aspect of the invention, there is provided a surface protective film peeling apparatus in the 11th aspect, wherein the positions of the press roller and the auxiliary roller can be adjusted in radial direction on the lower surface of the rotatable disk.

Specifically, in the apparatus according to the 12th aspect, even when peeling off the surface protective film of a wafer different in size, the apparatus can be applied to the particular wafer by adjusting the position of the press roller or the auxiliary roller.

According to a 13th aspect of the invention, there is provided a surface protective film peeling method for peeling off the surface protective film attached on the front surface of a wafer, comprising the steps of arranging the wafer on a wafer table according to any one of the first to seventh aspects with the front surface of the wafer up, supplying a peeling tape onto the surface protective film attached to the front surface of the wafer, pressing a part of the peeling tape against the surface protective film using a press means to thereby increase the adherension between the peeling tape and the surface protective film at the part of the peeling tape, and peeling off the surface protective film from the front surface of the wafer by the peeling tape using the part of the peeling tape having the increased adherension as a peeling start point.

Specifically, in the method according to the 13th aspect, the surface protective film can be peeled off from the wafer without attaching a loop of the peeling tape to the dicing film.

The above and other objects, features and advantages of the invention will be made apparent by the detailed description taken of typical embodiments of the invention in conjunction with the accompanying drawings.

BRIEF DESCRIPTION OF THE DRAWINGS

FIG. 13b is a top plan view of the wafer table arranged with the surface protective film peeling apparatus shown in FIG. 13a.

FIG. 14b is a top plan view of the wafer table arranged with the surface protective film peeling apparatus shown in FIG. 14a.

FIG. 16b is a top plan view of the wafer table arranged with the surface protective film peeling apparatus shown in FIG. 16a.

BEST MODE FOR CARRYING OUT THE INVENTION

Figure 1:
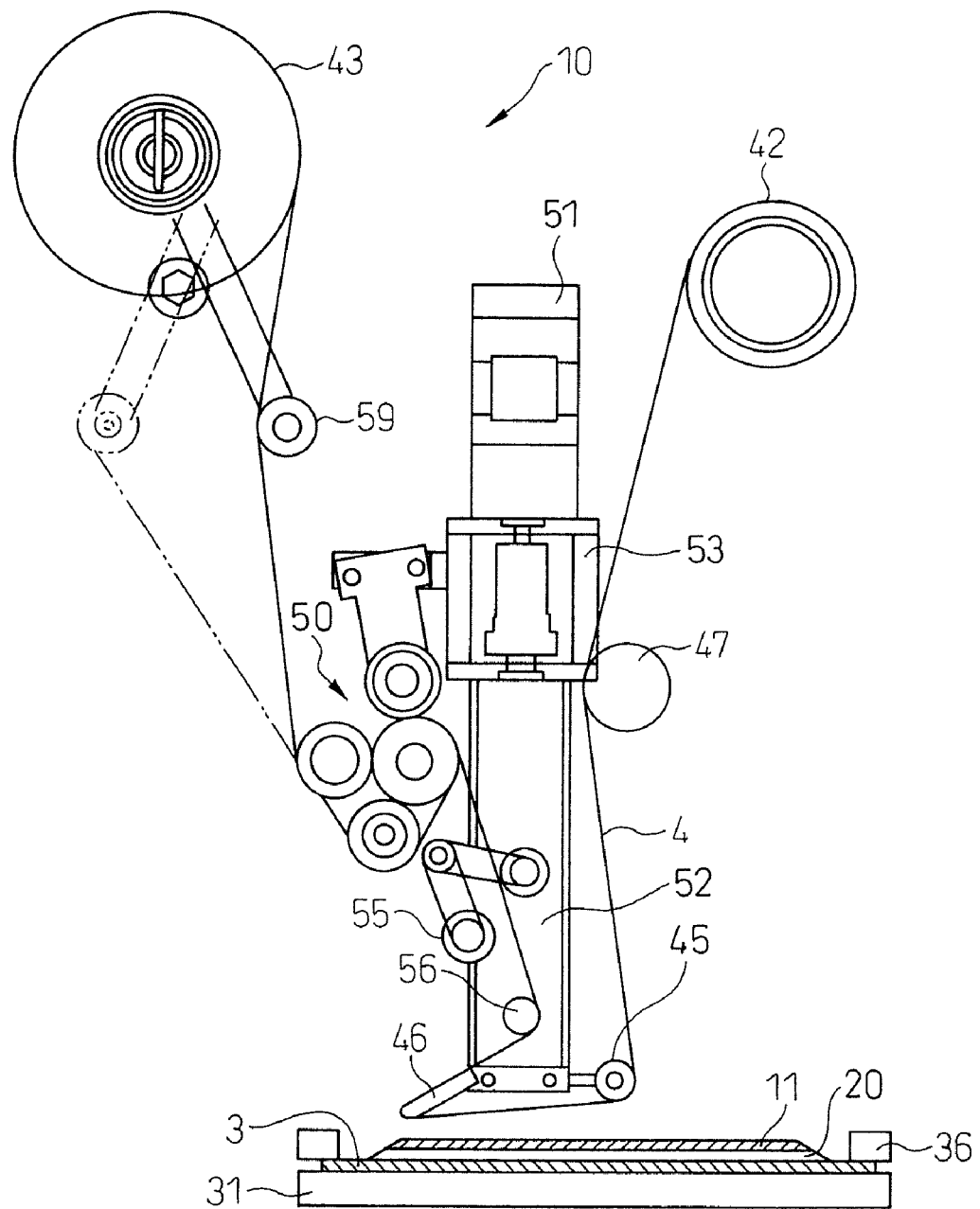
FIG. 1 is a schematic diagram showing the surface protective film peeling apparatus having a wafer table according to the invention.

The embodiments of the invention are explained below with reference to the accompanying drawings. In the drawings, similar or identical component members are designated by the same reference numerals, respectively, and the drawings are scaled to facilitate understanding.

Figure 17:
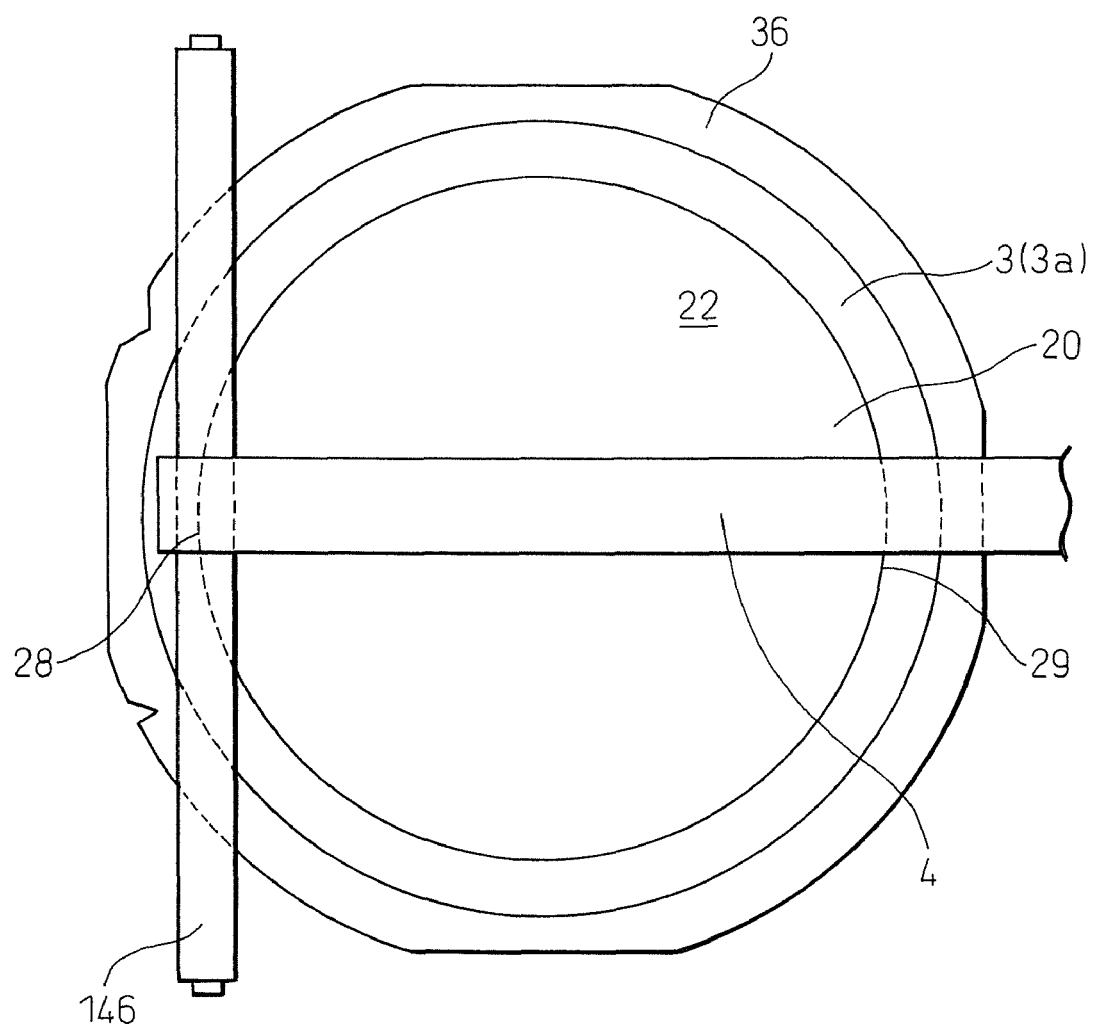
FIG. 17 is a top plan view of the wafer integrated with the mount frame.
Figure 18:
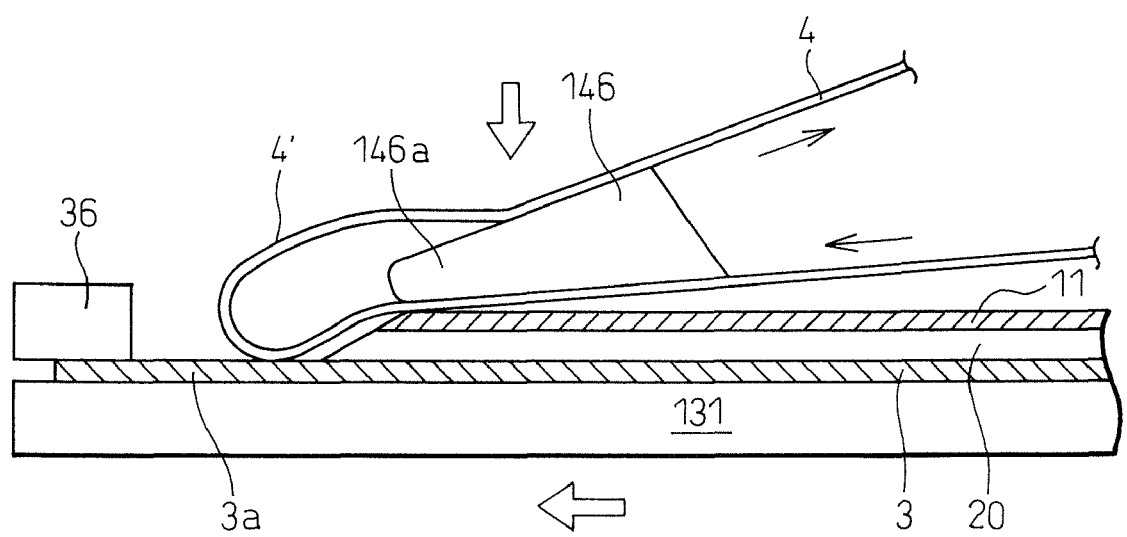
FIG. 18 is a side view showing the peel operation of the surface protective film according to the prior art.

FIG. 1 is a schematic diagram showing a surface protective film peeling apparatus including a wafer table according to the invention. A wafer 20 supplied to the surface protective film peeling apparatus 10 has the back surface thereof ground to a chamfered portion 26 on the side of the front surface thereof by back grinding, and is assumed to have the thickness of, for example, not more than 100 micrometers. Furthermore, as it is known, assuming that a surface protective film 11 for protecting the circuit pattern has already been attached to the front surface of the wafer 20. Further, as already explained with reference to FIG. 17, assuming that a dicing film 3 is attached to the ground surface 22 of the wafer 20 integrated with a mount frame 36 by the dicing film 3.

The surface protective film peeling apparatus 10 shown in FIG. 1 includes a supply unit 42 for supplying a peeling tape 4 to be attached on the surface protective film 11 of the wafer 20, and a take-up unit 43 for winding up the peeling tape 4 from the supply unit 42. The peeling tape 4 described below is what is called a pressure-sensitive tape exhibiting sticking action under pressure applied thereto or a heat-sensitive tape exhibiting sticking action with heat applied thereto.

As shown in FIG. 1, guide rolls 47, 45 for guiding the peeling tape 4 while at the same time applying a predetermined tension to the peeling tape 4 are arranged downstream of the supply unit 42. The peeling tape 4 is led to the take-up unit 43 through an attaching member 46 (press member) of the surface protective film peeling apparatus 10. As shown in FIG. 1, the forward end of the attaching member 46 has a rectangular or triangular section, and is arranged in such a direction as to contact the wafer 20 in a small area. Further, a guide roll 56, a dancer roll 55, a pair of pinch rolls 50 and another dancer roll 59 are arranged between the attaching member 46 and the take-up unit 43. The dancer rolls 55, 59 move in accordance with the amount of the peeling tape 4 supplied so that the tape taken up may not loosen.

The surface protective film peeling apparatus 10 has a shaft 52 inserted into a cover guide unit 53. Also, a motor 51 is mounted above the cover guide unit 53. As shown, the attaching member 46 is arranged at the bottom end of the shaft 52, and the guide rolls 56, 45 associated with the attaching member 46 are arranged at predetermined points of the shaft 52. Therefore, with the vertical motion of the shaft 52 along the cover guide portion 53 by a motor 51, the attaching member 46 and the guide rolls 56, 45 are also integrally moved in vertical direction. Incidentally, a configuration for vertically moving the shaft 52 using an air cylinder may alternatively be employed.

Further, a table 31 for holding the wafer 20 and the mount frame 36 is arranged under the attaching member 46. This table 31 is adapted to move in horizontal direction, i.e., in a lateral direction in FIG. 1. The table 31 can be moved also in a vertical direction.

Figure 2:
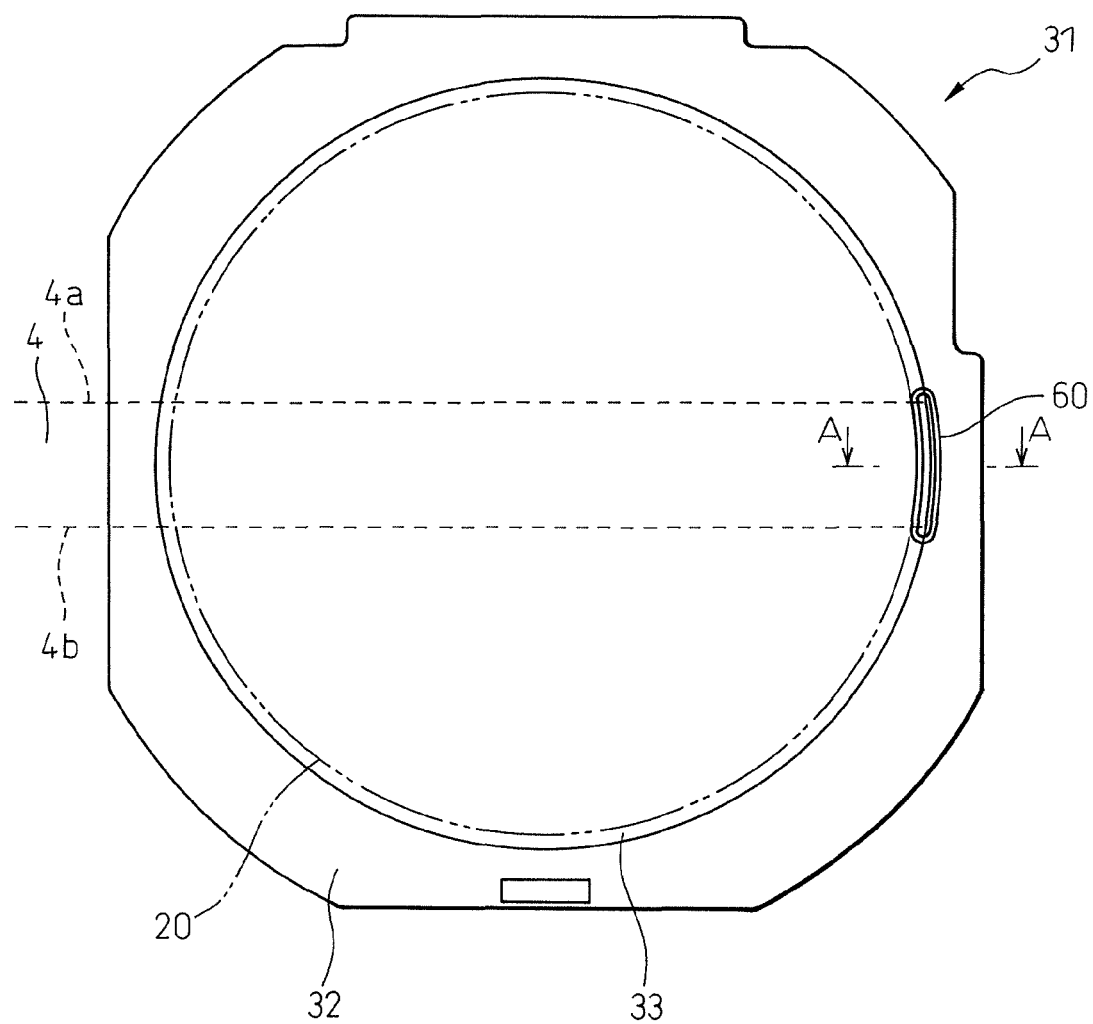
FIG. 2 is a top plan view of the wafer table according to a first embodiment of the invention.
Figure 3:
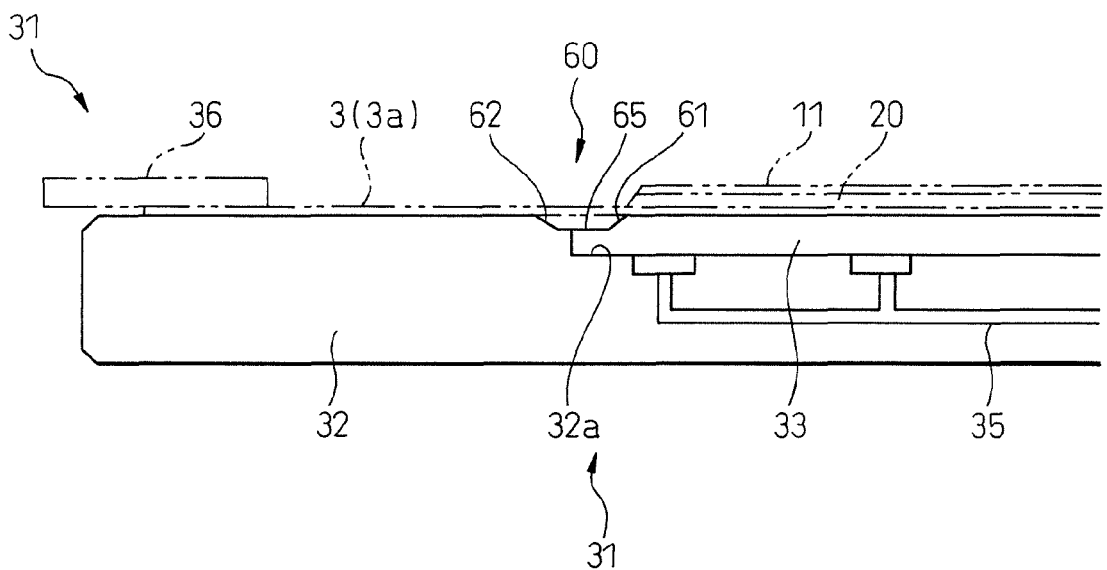
FIG. 3 is a side sectional view of the wafer table as taken along the line A-A in FIG. 2.

FIG. 2 is a top plan view of the wafer table according to a first embodiment of the invention, and FIG. 3 a side sectional view of the wafer table as taken along line A-A in FIG. 2. As shown in these drawings, the table body 32 of the table 31 has a contour substantially corresponding to the mount frame 36.

A depression 32a is formed at the center of the table body 32. A holding member 33 of disk type formed of a porous material is fitted in the depression 32a. As can be seen from FIG. 3, the upper surface of the adsorption member 33 is flush with the upper surface of the table body 32. Further, in the embodiment shown in FIGS. 2 and 3, the outer diameter of the adsorption member 33 is larger than that of the wafer 20. Furthermore, as shown in FIG. 3, an air duct 35 is connected to the lower surface of the adsorption member 33 and extends to a vacuum source not shown.

As can be seen from FIGS. 2 and 3, according to this invention, a groove 60 is formed along the edge of the adsorption member 33. As shown, the groove 60 is radially adjacent with the outside edge of the wafer 20 to be adsorbed to the table 31. In other words, the groove 60 is formed in the area of the table 31 corresponding to the outer periphery of the wafer 20. Strictly speaking, an inner slope 61 of the groove 60 corresponds to a part of the outer periphery of the wafer 20.

As shown in FIG. 3, the groove 60 is configured of bottom surface 65 and slopes 61, 62 formed at an acute angle of about 45° with respect to the upper surface of the table 31. The bottom surface 65 of the groove 60 is located on the boundary line between the table body 32 and the holding member 33. Specifically, according to the first embodiment, the slope 61 and a part of the bottom surface 65 constitute a part of the holding member 33.

Figure 13A:
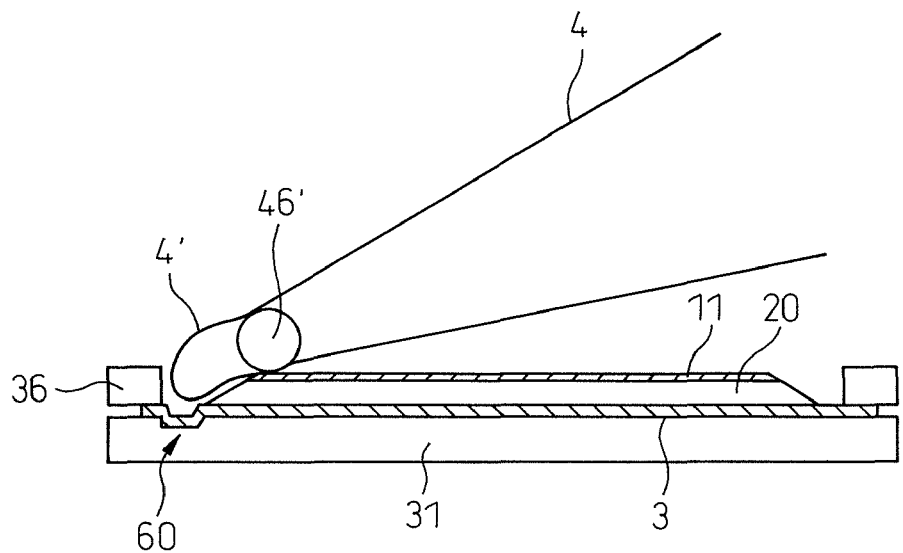
FIG. 13a is a side view schematically showing another surface protective film peeling apparatus according to the invention.

Furthermore, as can be seen from FIG. 2, the length of the groove 60 is larger than the width of the peeling tape 4. Incidentally, the groove 60 is not necessarily arcuate, but as long as the length of the groove 60 is larger than the width of the peeling tape 4, may assume another shape. In an example of such another shape, as shown in FIG. 13a, the outside portion 63 of the groove 60 is linear and extends in parallel to the tangential line of the wafer 20. In this case, the outside portion 63 is not necessarily a slope but may be perpendicular to the surface of the table body 32. This groove 60, for its simple shape, can be easily formed.

Figure 4:
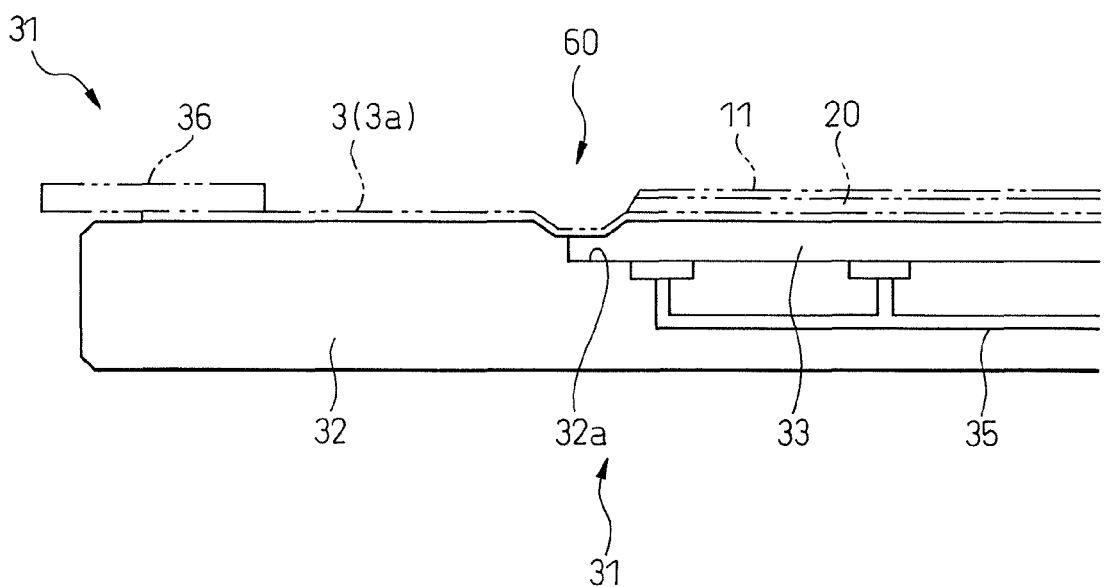
FIG. 4 is another side sectional view of the wafer table.
Figure 5A:
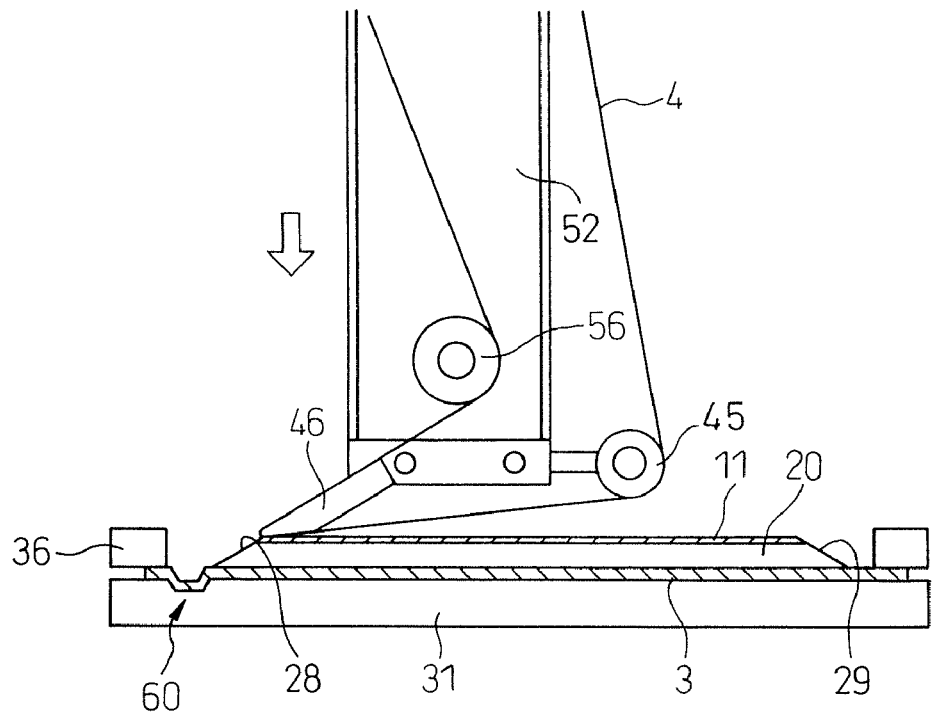
FIG. 5a is a first diagram showing the peel operation of the surface protective film.
Figure 5B:
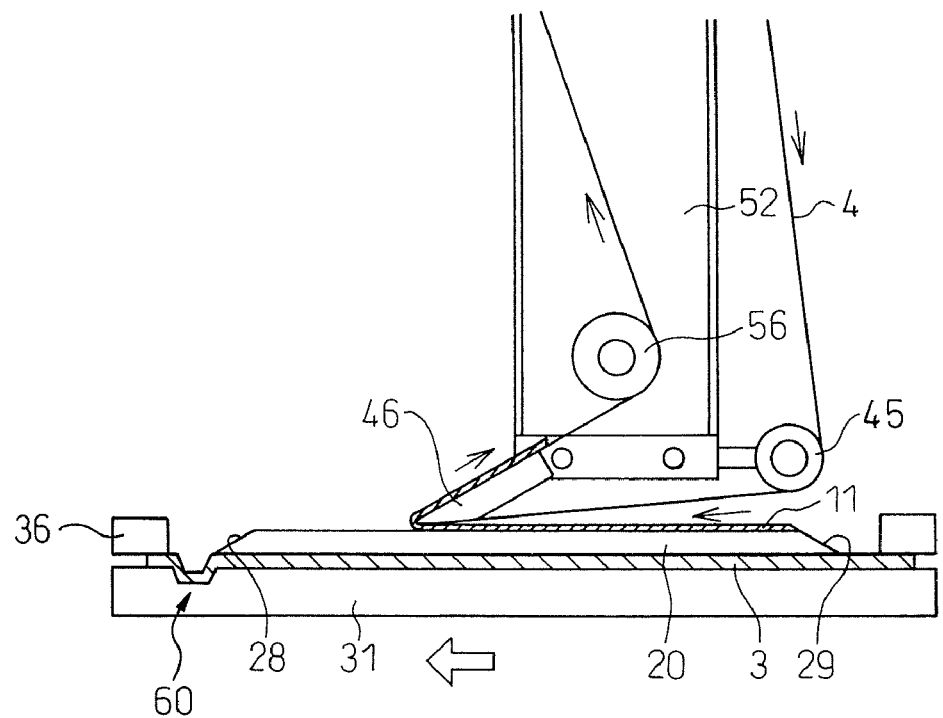
FIG. 5b is a second diagram showing the peel operation of the surface protective film.

FIG. 4 is another side sectional view of the wafer table, and FIGS. 5a, 5b first and second diagrams, respectively, showing the peel operation of the surface protective film. With reference to FIGS. 3 to 5b, the peeling operation of the surface protective film 11 according to the first embodiment of the invention is explained below.

First, as shown in FIG. 3, the wafer 20 integrated with the mount frame 36 by the dicing film 3 is arranged on the table 31 (see FIG. 3). Then, upon activation of a vacuum source not shown, suction is applied through the air duct 35 and the holding member 33, so that the wafer 20 is held on the adsorption member 33 of the table 31.

The adsorption member 33 is formed of a porous material, and therefore, upon activation thereof, the suction applied to the holding member 33 is also applied to a part of the bottom surface 65 and the inner slope 61 of the groove 60. Therefore, as shown in FIG. 4, the dicing film 3 collapses into the groove 60. Specifically, according to this invention, the groove 60 has the suction function, and therefore, the dicing film 3 is positively collapsed in the groove 60.

Then, the motor 51 shown in FIG. 1 is driven and the shaft 52 is moved down as indicated by arrow in FIG. 5a. As a result, an attaching member 46 arranged at the bottom end portion of the shaft 52 presses the peeling tape 4 against the surface protective film 11 at the edge of the wafer 20. Thus, the peeling tape 4 is attached to the surface protective film 11 located in the neighborhood of an end 28 of the wafer 20.

After that, as indicated by the arrow in FIG. 5b, the table 31 is moved horizontally toward an end 28 of the wafer 20 from the other end 29 thereof. At the same time, the peeling tape 4 is supplied from the supply unit 42 and taken up on the take-up unit 43. As a result, the portion where the peeling tape 4 is attached functions as a peeling start point, and the surface protective film 11 is gradually peeled off from the peeling start point at the end 28 of the wafer 20.

Upon complete peel-off operation of the surface protective film 11, the suction operation of the adsorption member 33 is suspended. The suction operation in the groove portion is also suspended at the same time, and therefore, the mount frame 36 can be easily recovered from the table 31. Depending on the material of the dicing film 3, the dicing film 3 may be closely attached to the table surface and the groove due to the self-adherence characteristic thereof. In such a case, the dicing film 3 may be slowly restored to the original position. To avoid this inconvenience, the pressure-controlled air or the like is desirably supplied to the groove 60 and the holding surface of the table through the air duct 35 and the holding member 33. As a result, the dicing film 3 closely attached and deformed in the groove can be released and quickly restored to the original position.

Figure 6:
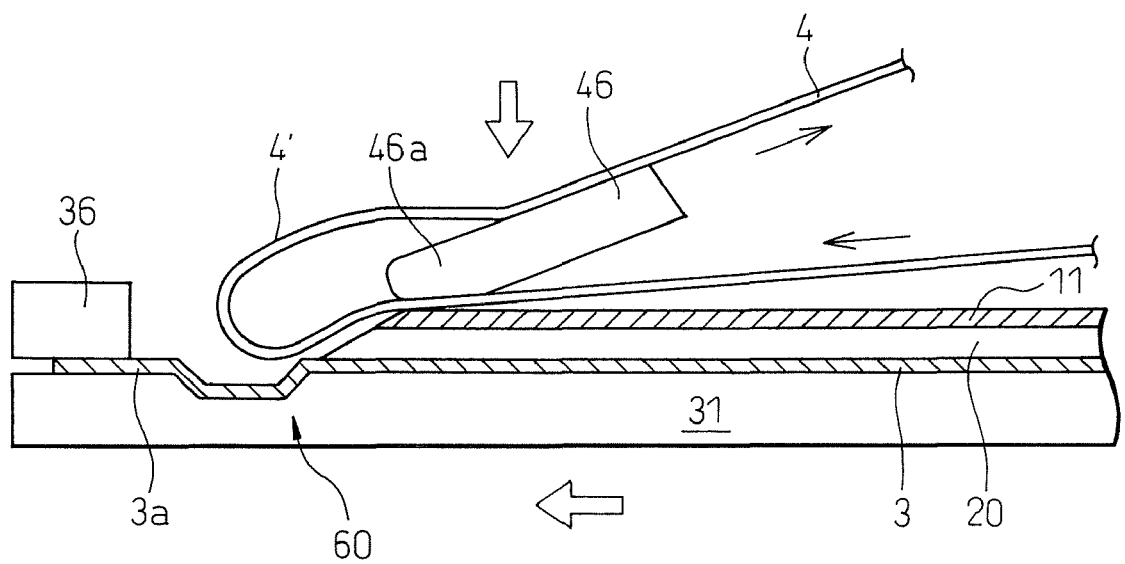
FIG. 6 is another side view of the wafer table.

As shown in FIG. 6, at the time of driving the supply unit 42 and the take-up unit 43, the peeling tape 4 at the forward end 46a of the attaching member 46 may loosen with the result that a loop 4' may be formed. According to this invention, the dicing film 3 is collapsed in the groove 60, and therefore, the loop 4' of the peeling tape 4 fails to reach the dicing film 3. Thus, according to this invention, the peeling tape 4 is prevented from attaching to the exposed surface 3a of the dicing film 3.

Especially if the loop 4' of the peeling tape 4 has been formed, the edge portions 4a, 4b of the peeling tape 4 are liable to attach to the exposed surface 3a of the dicing film 3. According to this invention, the length of the groove 60 is larger than the width of the peeling tape 4, and therefore, the part of the dicing film 3 corresponding to the edges 4a, 4b of the peeling tape 4 are positively collapsed in the groove 60. As a result, the edge portions 4a, 4b of the peeling tape 4 are prevented from attaching to the dicing film 3.

Furthermore, as explained above with reference to FIG. 3, according to this invention, the side surfaces of the groove 60 are formed as the slopes 61, 62 at an acute angle. The extension of the dicing film 3 at the time of adsorption, therefore, is limited by the slopes 61, 62. With the extension of the dicing film 3, therefore, the wafer 20 is prevented from being pulled. As a result, the wafer 20 is prevented from being pulled and broken by the dicing film 3.

Incidentally, though not shown in the drawings, the groove 60 may be formed in such a manner that the suck operation works on the whole of the slopes 61, 62 and the bottom surface 65. Such a case is also included in the scope of the invention.

Figure 7:
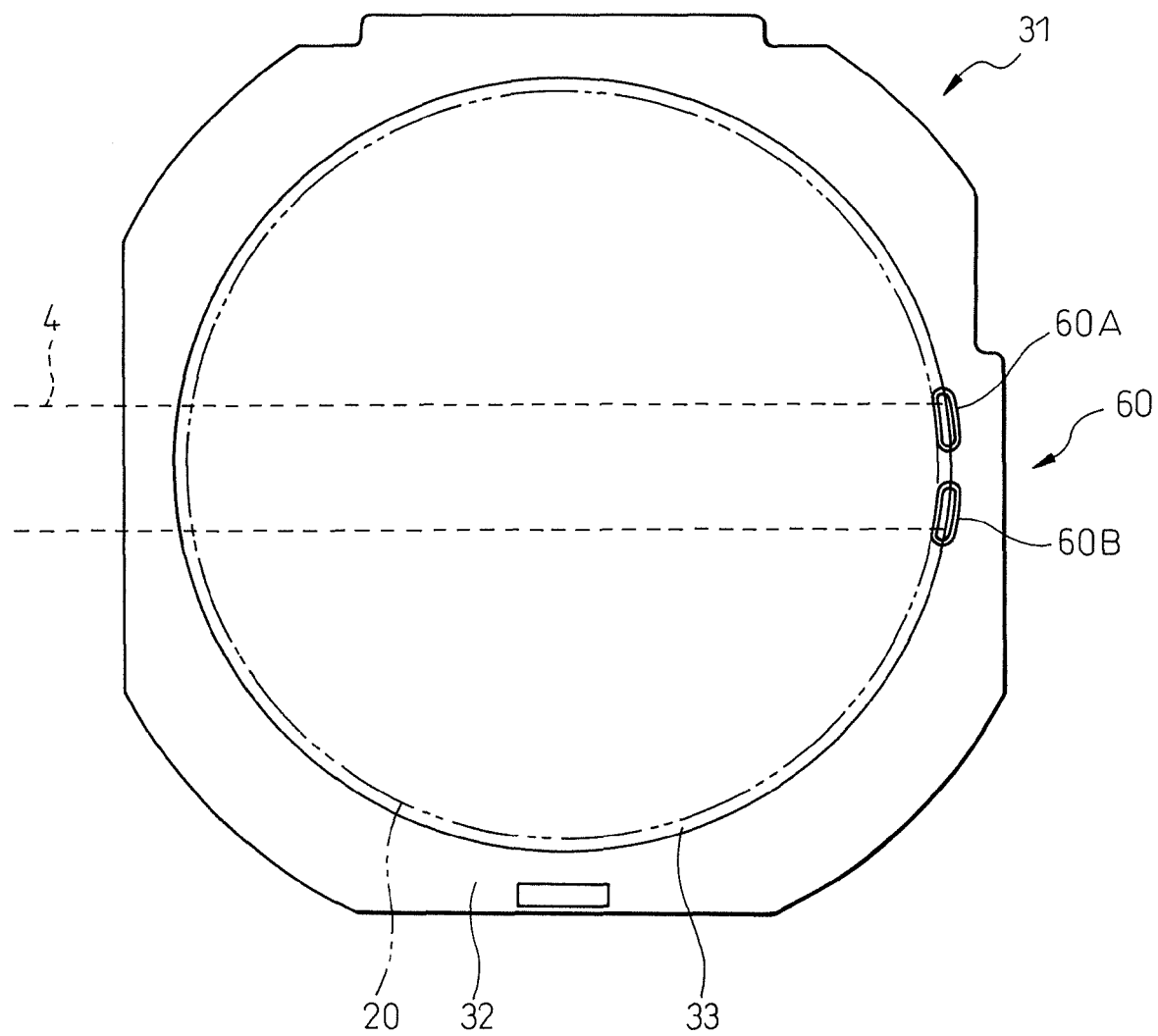
FIG. 7 is a top plan view of the wafer table according to a second embodiment of the invention.
Figure 8:
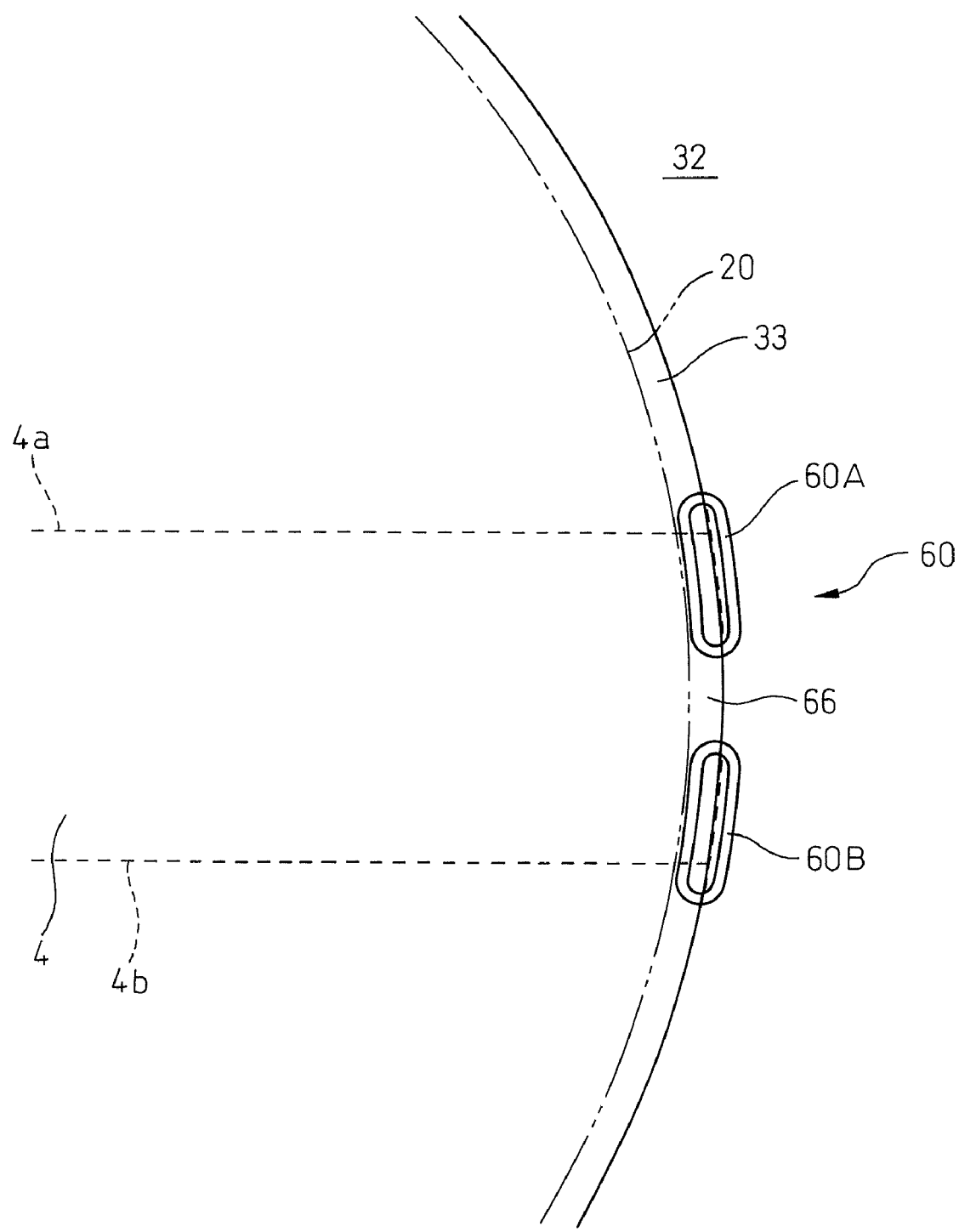
FIG. 8 is a top plan view showing, in enlarged form, a part of the wafer table of FIG. 7.

FIG. 7 is a top plan view of the wafer table according to a second embodiment of the invention, and FIG. 8 a top plan view of a part, in enlarged form, of the wafer table shown in FIG. 7. According to the second embodiment, the groove 60 is configured of a first groove 60A and a second groove 60B. As shown, the first groove 60A and the second groove 60B are formed along the edge of the adsorption member 33. Furthermore, an intermediate portion 66 (see FIG. 8) between the first groove 60A and the second groove 60B constitutes a part of and is arranged flush with the adsorption member 33.

As can be seen from FIG. 8, the first groove 60A and the second groove 60B are formed in such a manner that one of the edges 4a of the peeling tape 4 is located in the first groove 60A and the other edge 4b is located in the second groove 60B. This configuration, like the configuration described above, prevents the edges 4a, 4b of the peeling tape 4 from attaching to the dicing film 3.

Further, according to the second embodiment, the presence of the intermediate portion 66 prevents the part of the dicing film 3 corresponding to the intermediate portion 66 from collapsing in the first groove 60A and the second groove 60B. As a result, the extension of the dicing film 3 when collapsing in the groove is partially suppressed. Like in the configuration described above, therefore, the wafer 20 is prevented from being pulled and broken by the dicing film 3.

Further, according to the second embodiment, since the dicing film 3 is extended only to a small degree, the dicing film 3 is easily restored to the original position even after suspension of the suction operation of the adsorption member 33. As a result, the dicing film 3 is not left extended and the wafer 20 integrated with the mount frame 36 is prevented from being reduced in handling in the subsequent steps.

Figure 9:
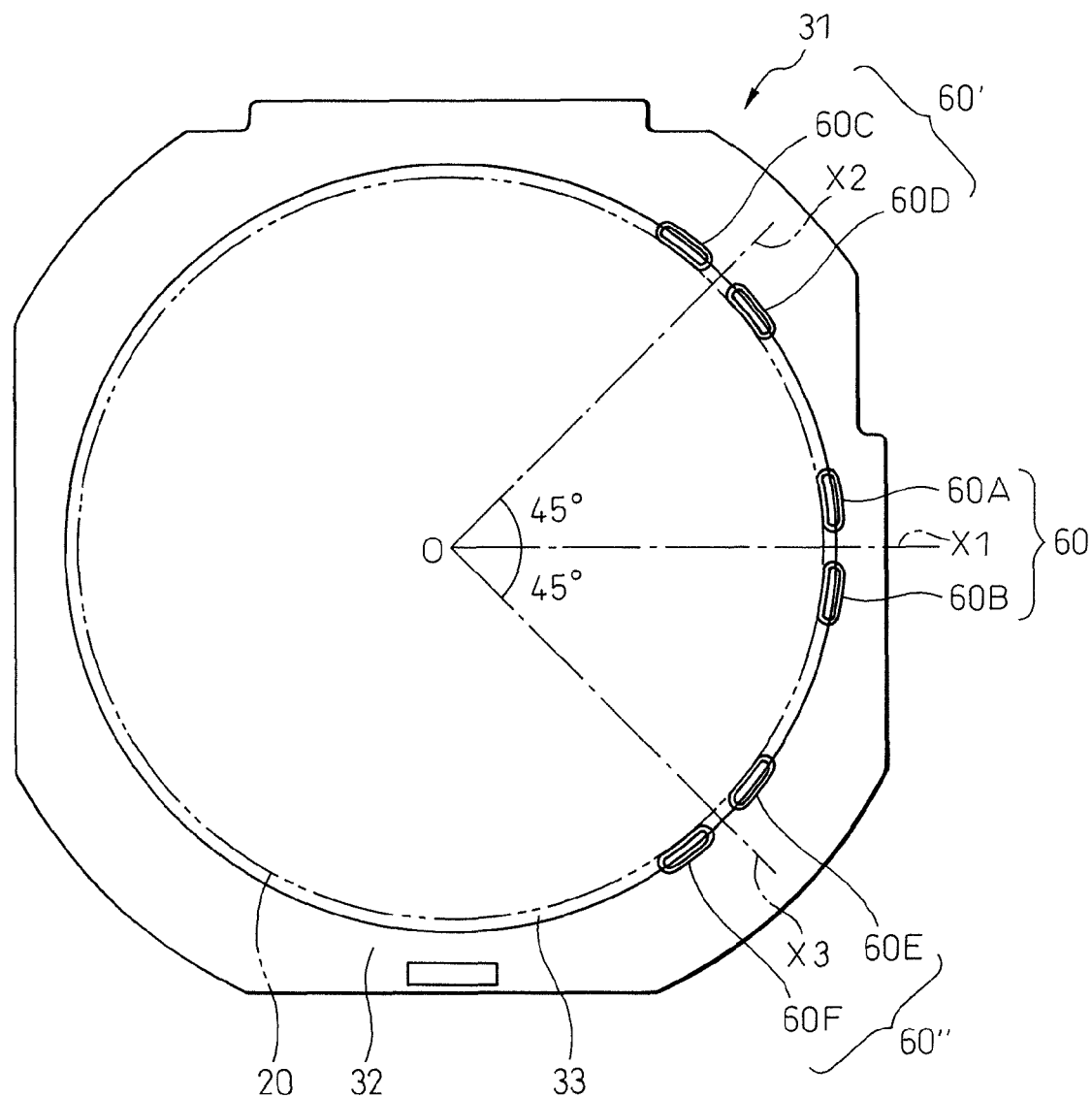
FIG. 9 is a top plan view of the wafer table according to a third embodiment of the invention.

FIG. 9 is a top plan view of the wafer table according to a third embodiment of the invention. According to the third embodiment, in addition to the groove set 60 including the first groove 60A and the second groove 60B, a groove set 60' including a third groove 60C and a fourth groove 60D and a groove set 60" including a fifth groove 60E and a sixth groove 60F are formed along the edge of the adsorption member 33.

As can be seen from FIG. 9, the line segment X1 connecting the center 0 of the wafer 20 and the set 60 is at an angle of 45 degrees to the line segment X2 connecting the center 0 and the set 60'. Further, the line segment X3 connecting the center 0 and the set 60" is at an angle of 45 degrees to the line segment X1.

If a square circuit pattern C is formed on the surface of the wafer 20, the arrangement of the wafer 20 at a predetermined position leads to the arrangement of the line segments X2, X3 parallel to the bisector of the corner of the circuit pattern C. With reference to the top plan view of FIG. 9 and FIG. 10 showing a part of the wafer in enlarged form, let us consider a case in which the peeling tape 4 is attached in parallel to the line segment X2 and then the surface protective film 11 is peeled off along the line segment X2.

Figure 10:
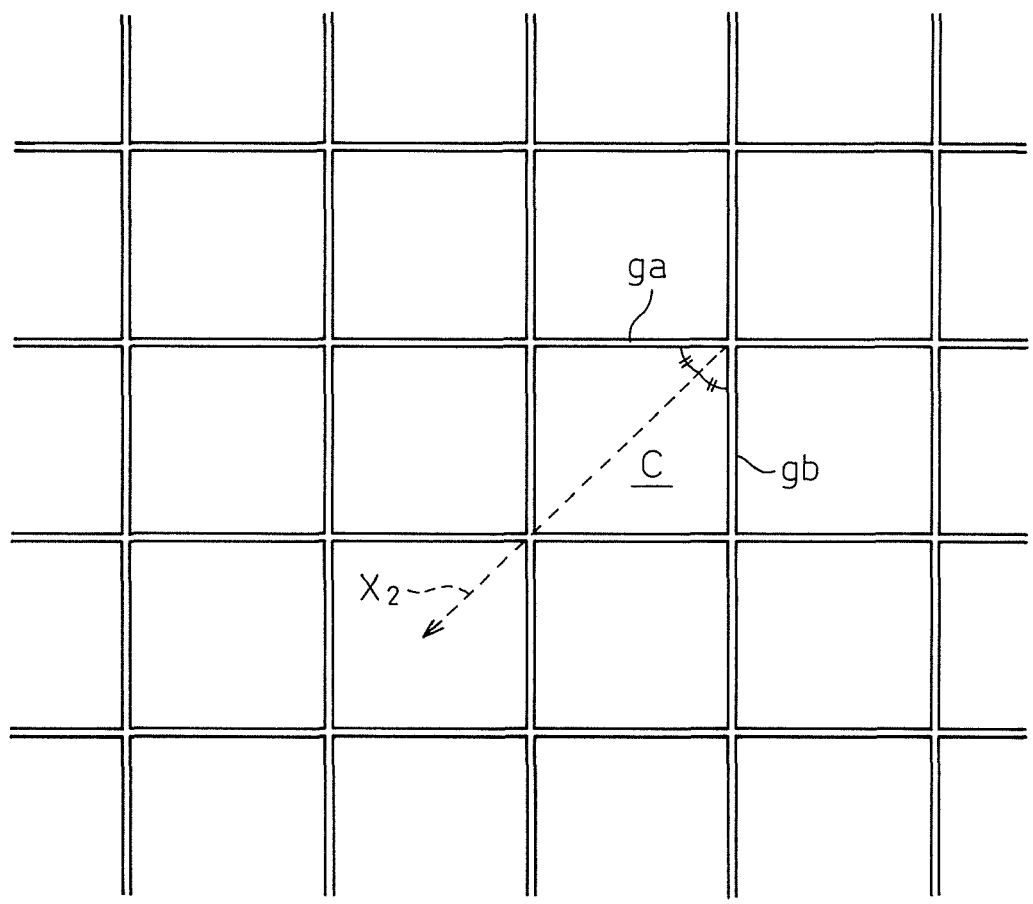
FIG. 10 is a top plan view showing a part of the wafer in enlarged form.

In the case where the surface protective film 11 is peeled off as described above, the forces exerted on the two pattern grooves ga, gb making up a corner of the single circuit pattern C shown in FIG. 10 are equal to each other. When peeling off the surface protective film 11, therefore, the adhesive for the surface protective film 11 does not remain in a great amount only on one of the pattern grooves ga, gb. Specifically, the adhesive for the surface protective film 11 is removed equally from the corner of the circuit pattern along the pattern grooves ga, gb so that the adhesive is prevented from being left as a residue in the pattern grooves ga, gb. In other words, according to the third embodiment, the surface protective film 11 can be easily peeled off.

According to the first to third embodiments, the adsorption member 33 is considerably larger than the wafer 20, and therefore, the groove 60 can be formed without superposition with the wafer 20. If the size of the holding member 33 is substantially equal to the size of the wafer 20, the groove is required to be formed on the outside of the adsorption member 33 not to be superposed with the wafer 20. However, the groove formed in such a case, is away from the holding member 33, and therefore, cannot have the sucking function. With reference to the top plan view of FIG. 11 showing a part of the wafer table in enlarged form and the side sectional view of FIG. 12 showing the wafer table according to a fourth embodiment of the invention, an explanation is made below about a case in which the holding member 33 and the wafer 20 have substantially the same size.

Figure 11:
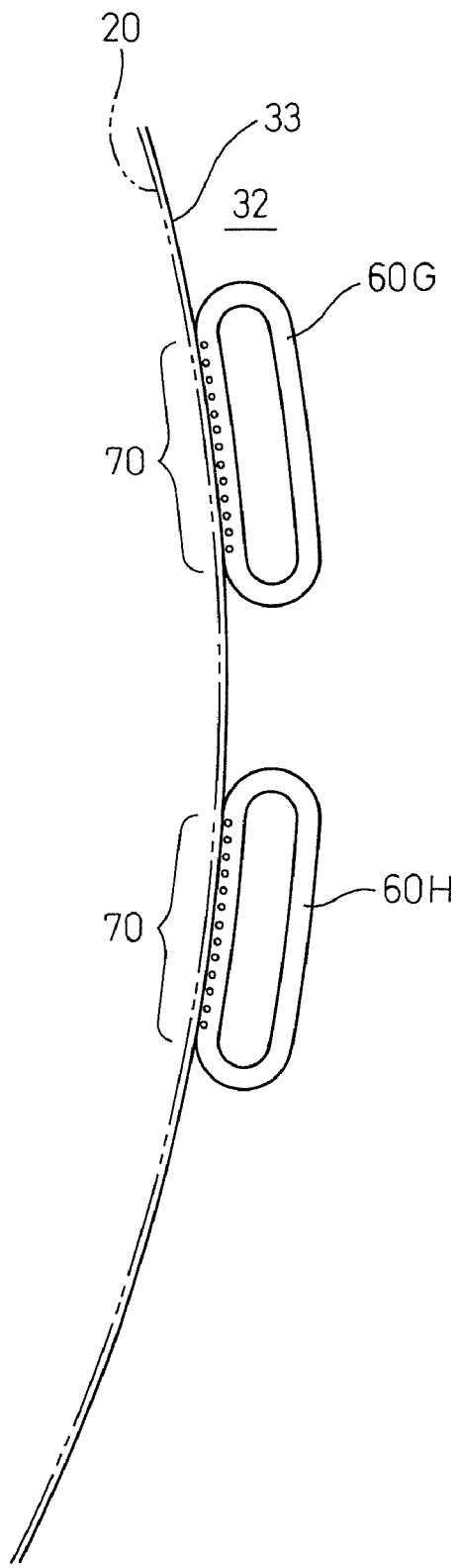
FIG. 11 is a top plan view showing, in enlarged form, a part of the wafer table according to a fourth embodiment of the invention.
Figure 12:
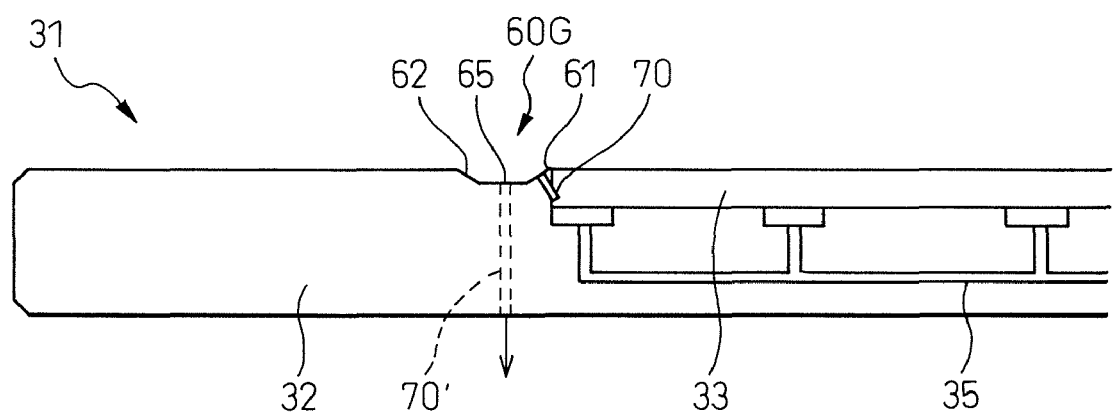
FIG. 12 is a side sectional view of the wafer table shown in FIG. 11.

In FIGS. 11 and 12, the two grooves 60G, 60H are formed on the surface of the table body 32 adjacent to the adsorption member 33. As can be seen from FIGS. 11 and 12, a plurality of conduction holes 70 extending to the holding member 33 are formed in the inner slope 61 of the grooves 60G, 60H.

In such a case, the suction operation of the holding member 33, if activated, works also on the grooves 60G, 60H through the conduction holes 70. As a result, the dicing film 3 is similarly collapsed in the grooves 60G, 60H and held to the inner surfaces of the grooves 60G, 60H. It will thus be understood that a similar effect to those described above can be obtained also by the fourth embodiment.

Incidentally, in place of or in addition to the conduction holes 70 communicating with the holding member 33, another path 70' connected to another vacuum source (not shown) may be formed on the holding member 33. In FIG. 12, such another path 70' extends downward from the bottom surface 65. In this case, the dicing film 3 is adherred to the grooves 60G, 60H without operating together with the holding of the wafer 20 by the adsorption member 33.

Such configuration is advantageous in the case where the dicing film 3 cannot be sufficiently held only by the suction operation of the holding member 33, in the case where the quick suction of the dicing film 3 and suspension thereof are desired, and in the case where the suction of the dicing film 3 and the suspension thereof are separately controlled by different control devices.

Figure 13B:
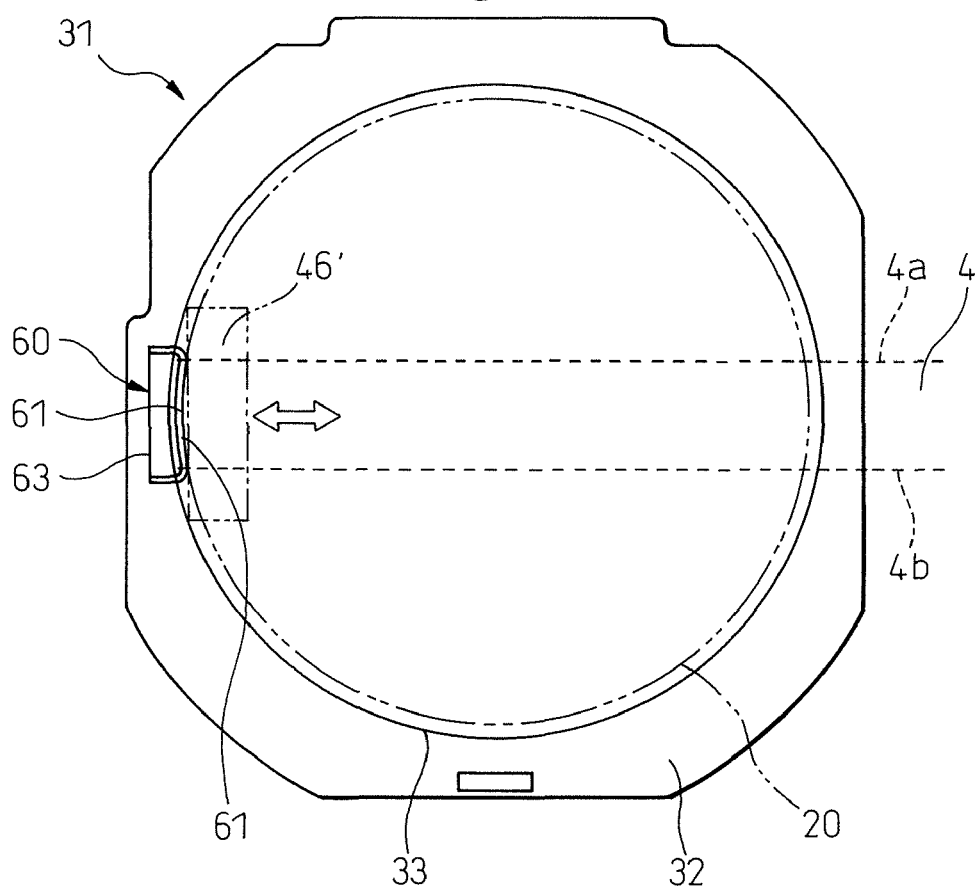

FIG. 13a is a side view schematically showing another surface protective film peeling apparatus according to this invention, and FIG. 13b a top plan view of the wafer table arranged with the surface protective film peeling apparatus shown in FIG. 13a. The attaching member 46' shown in FIGS. 13a, 13b is a cylindrical roll. Also in the case where the roll-type attaching member 46' is used, the loop 4' of the peeling tape 4 is prevented from being attached the exposed surface of the dicing film 3.

Figure 14A:
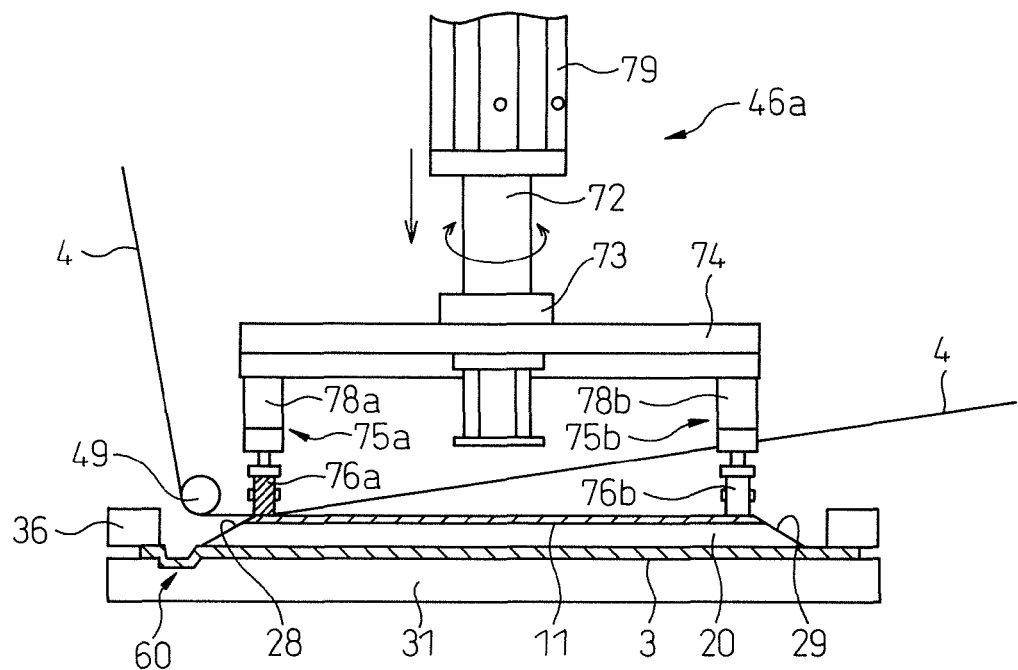
FIG. 14a is a side view schematically showing still another surface protective film peeling apparatus according to the invention.
Figure 14B:
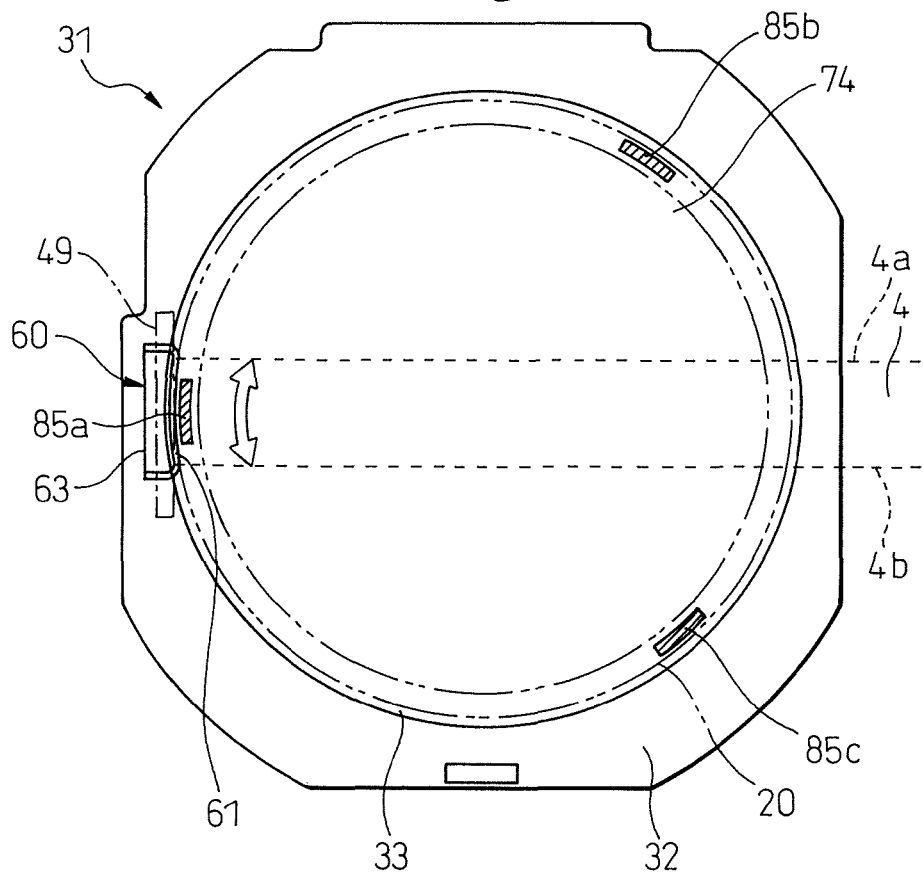

FIG. 14a is a side view schematically showing still another surface protective film peeling apparatus according to this invention, and FIG. 14b a top plan view of the wafer table arranged with the surface protective film peeling apparatus shown in FIG. 14a. The peeling apparatus 46a shown in FIG. 14a includes a cylinder 79, in which a vertically movable rod 72 is inserted. The rod 72 moves vertically in accordance with the operation of an actuator not shown and can be rotated at the desired position.

Further, as can be seen from FIG. 14a, a disk 74 is coupled to the rod 72 in the neighborhood of the forward end thereof by a coupler 73. The diameter of the disk 74 is substantially equal to or larger than the diameter of the wafer 20. The disk 74 can be rotated together with or separately from the rod 72. Furthermore, at least one press member 75 or three of them, for example, are arranged on the lower surface of the disk 74. Among these three press members, the press members 75a, 75b shown include extensions 78a, 78b and press rollers 76a, 76b mounted at the forward ends of the extensions 78a, 78b, respectively. This is also the case with the remaining press member 75c not shown in FIG. 14a.

Figure 15:
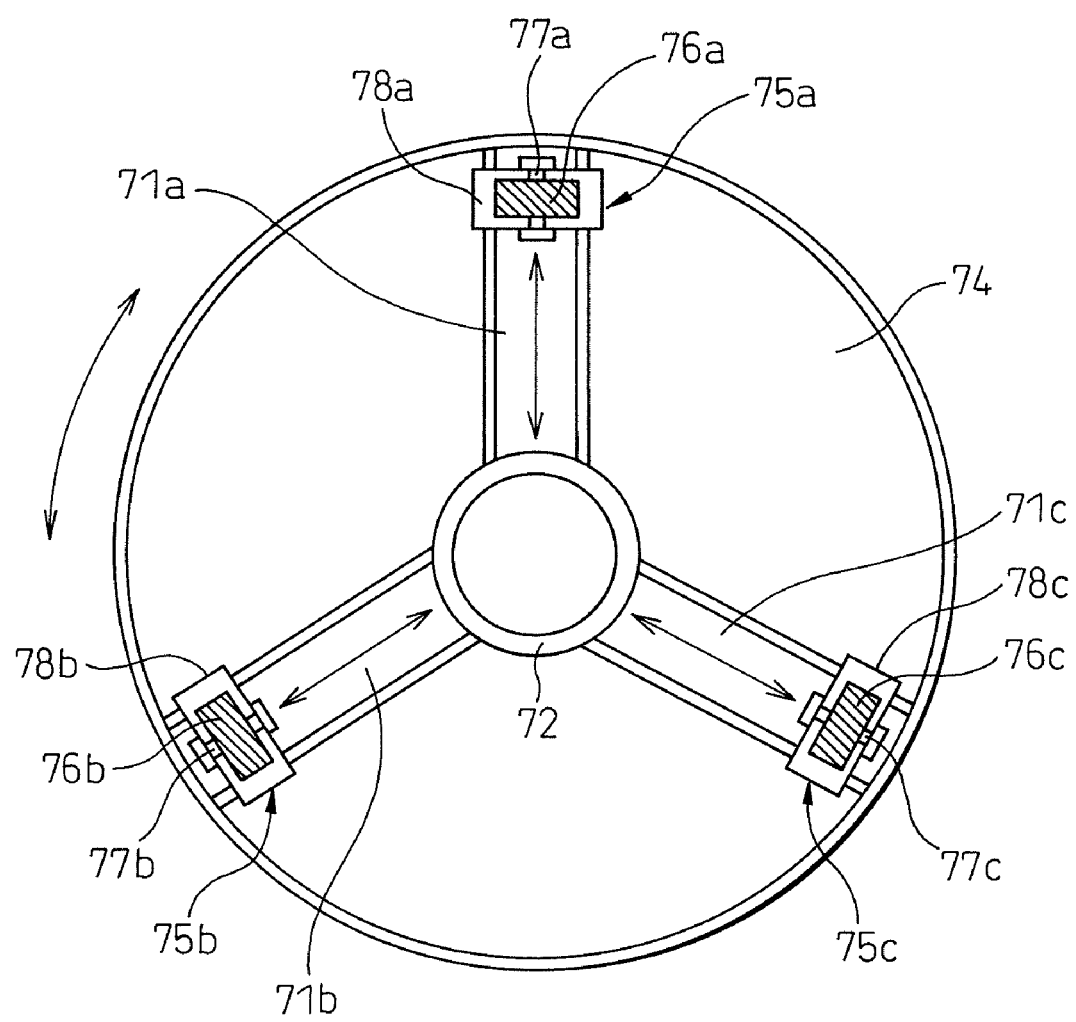
FIG. 15 is a bottom view of the rotatable disk.

FIG. 15 is a bottom view of the rotatable disk 74. The disk 74 shown in FIG. 15 includes three press members 75a, 75b, 75c. These press members 75a, 75b, 75c are arranged in the neighborhood of the forward end of the three guide grooves 71a, 71b, 71c, respectively, extending in radial direction on the lower surface of the disk 74. An engaging portion (not shown) adapted to engage each of the guide grooves 71a, 71b, 71c, respectively, is arranged at the base end of the corresponding one of the extensions 78a, 78b, 78c of the press members 75a, 75b, 75c. Upon engagement of each engaging portion with the corresponding one of the guide grooves 71a, 71b, 71c, the press members 75a, 75b, 75c can be mounted in the guide grooves 71a, 71b, 71c, respectively. Furthermore, each engaging portion of the extensions 78a, 78b, 78c can slide along the corresponding one of the guide grooves 71a, 71b, 71c, so that the press members 75a, 75b, 75c can be positioned in the desired point in the guide grooves 71a, 71b, 71c, respectively. Even if the surface protective film 11 of the wafer 20' different in size is peeled off, therefore, the surface protective film peeling apparatus 10 according to the invention can be easily applied to the wafer 20' of a different size by adjusting the position of the press members 75a, 75b, 75c.

Furthermore, as can be seen from FIG. 15, the guide grooves 71a, 71b, 71c are formed at angles of about 120° to each other. In FIG. 15, therefore, the three press members 75a, 75b, 75c are arranged substantially equidistantly on the lower surface of the disk 74. Incidentally, at least one of the distances between adjacent two of the three press members 75a, 75b, 75c is assumed to be larger than the width of the peeling tape 4. Also, the press rollers 76 of the press members 75 are mounted in such a manner that the rotary shaft 77 of each press roller 76 is directed radially of the disk 74.

As shown in FIG. 14a, the peeling tape 4 runs on the press roller 76a and the roll 49 arranged above the groove 60. With the downward movement of the attaching member 46a, the wafer 20 are pressed by the press rollers 76a, 76b, 76c. The press roller 76a presses the wafer 20 via the peeling tape 4, and the remaining press rollers 76b, 76c (auxiliary rollers) directly press the wafer 20.

As shown in FIG. 14b, press points 85a, 85b, 85c are formed by the press rollers 76a, 76b, 76c, respectively. As shown in FIG. 14b, the press point 85a is formed in the neighborhood of the edge of the wafer 20 on the peeling tape 4. At the press point 85a, the adherence between the peeling tape 4 and the surface protective film 11 is increased. Thus, the press point 85a can function as a peeling start point. By moving the peeling tape 4 and the table 31 as described above, therefore, the surface protective film 11 can be peeled off from the surface of the wafer 20.

Incidentally, the press roller 76a is preferably reciprocated within the region of the peeling tape 4 by rotating the disk 74 slightly after the press rollers 76a, 76b, 76c come into contact with the wafer 20 (see the arrow in FIG. 14b). In this case, the adherence at the press point 85a by the press roller 76a can be easily and positively improved.

In the absence of the peeling tape 4 at the press points 85b, 85c shown in FIG. 14b, the press rollers 76a, 76b corresponding to the press points 85b, 85c have no effect on the adherence between the peeling tape 4 and the surface protective film 11. Therefore, the press rollers 76a, 76b may be excluded.

However, in such a case, the single press member 75a is supported in cantilever fashion at the time of pressing, and therefore, the load may be concentrated at the engaging portion of the press member 75a, etc. thereby possibly damaging the press member 75a. For this reason, the press members 75b, 75c functioning as auxiliary rollers applying no pressure to the peeling tape 4 are desirably arranged to distribute the load at the time of pressing. As a result, the single press member 75 is prevented from breakage while at the same time improving the adherence between the peeling tape and the film in very stable state.

Figure 16A:
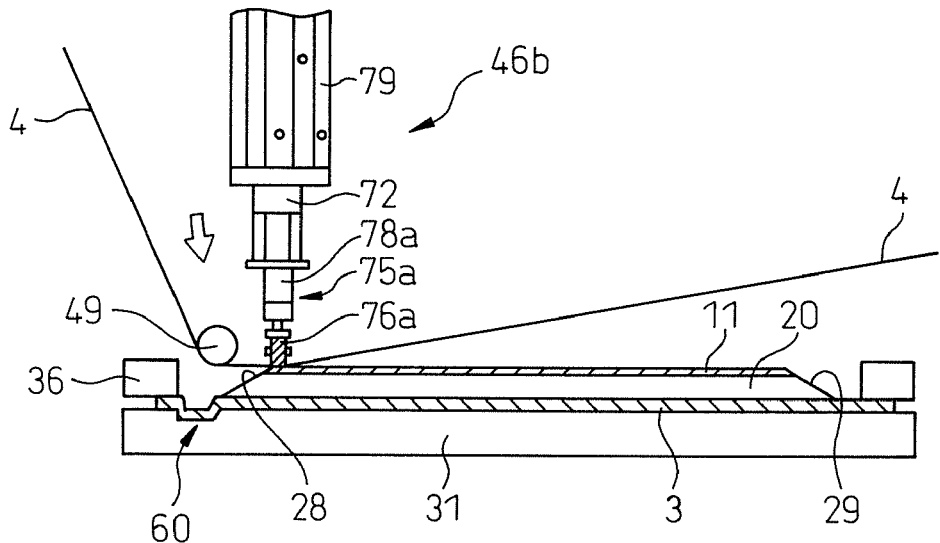
FIG. 16a is a side view schematically showing yet another surface protective film peeling apparatus according to the invention.
Figure 16B:
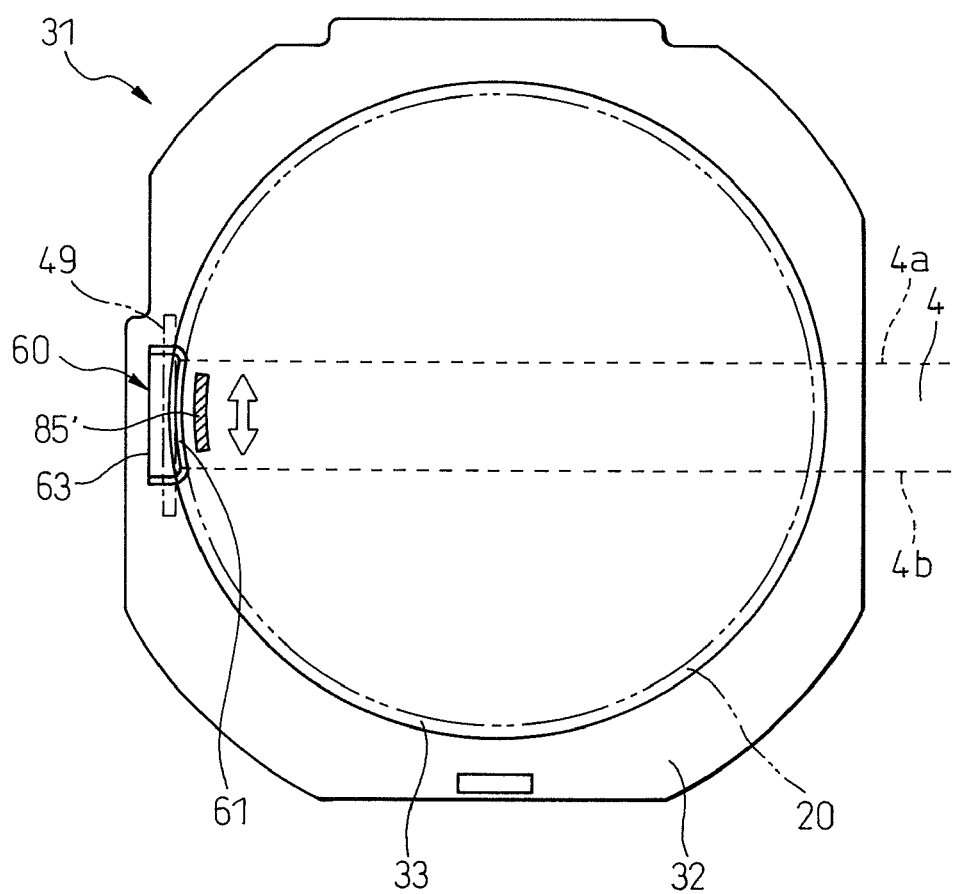

FIG. 16a is a side view schematically showing still another surface protective film peeling apparatus according to the invention, and FIG. 16b a top plan view of the wafer table arranged with the surface protective film peeling apparatus shown in FIG. 16a. In the presence of a single press member 75a, it is sufficient to arrange the press member 75a at the forward end of the rod 72 like the roll-type attaching member. In this case, the peeling tape 4 runs on the roll 49 arranged above the groove 60 and the press roller 76a of the attaching member 46b.

In the configuration shown in FIGS. 16a, 16b, the peeling tape 4 is pressed against the surface protective film 11 at the edge of the wafer 20 by the press roller 76a of the press member 75a. The press point 85' thus formed functions as a peeling start point. As described above, therefore, the surface protective film 11 can be peeled off from the front surface of the wafer 20 by moving the peeling tape 4 and the table 31.

Furthermore, according to the embodiment shown in FIG. 16a, the press point 85' can be easily pressed simply by rolling the press roller 76a transversely of the peeling tape 4. As a result, the adherence between the peeling tape 4 and the surface protective film 11 at the press point 85' can be further improved.

Incidentally, in FIGS. 13, 14 and 16, the outer side portion 63 of the groove 60 of the table 31 is shown in linear form. However, the table 31 shown in FIGS. 13, 14 and 16, may be also formed with a similar groove to the groove 60 shown in FIG. 2. It is apparent that such a configuration is also included in the scope of the invention.

Although the invention has been described above with reference to typical embodiments thereof, it will be easily understood by those skilled in the art that the invention can be variously modified, omitted or added to in the way described above or other than the way described above without departing from the scope of the invention.

DESCRIPTION OF NOTATIONS 3 dicing film
3a exposed surface
4 peeling tape
4' loop
4a, 4b edge
10 surface protective film peeling apparatus
11 surface protective film
20 wafer
22 back surface
31 table
32 table body
32a depression
33 adsorption member
35 air duct
36 mount frame
42 supply unit
43 take-up unit
46, 46' 46a, 46b attaching member
51 motor
52 shaft
53 cover guide unit
60, 60A to 60H groove
61, 62 slope
65 bottom surface
66 intermediate portion
70 conduction hole
70' path
72 rod
74 disk
75a, 75b, 75c press member
76a, 76b, 76c press roller
77a, 77b, 77c rotary shaft 78a, 78b, 78c extension
71a, 71b, 71c guide groove
79 cylinder
85a, 85b, 85c press point

The invention claimed is:

1. A wafer table for adsorbing a wafer having a back surface supported on a mount frame via a dicing film and a front surface with a surface protective film attached thereon, the surface protective film having a peeling tape attached thereon, comprising:
    holding means for holding the wafer to a surface of the table;
    a first groove and a second groove formed in an area of the table corresponding to at least a part of an outer periphery of the wafer, wherein the first groove is formed in the area covering only one transverse edge of the peeling tape, and a second groove formed in the area covering only the other transverse edge of the peeling tape, wherein a distance between the first groove and a center of the table is equal to a distance between the second grove and the center of the table; and
    a suction means for sucking the air in the groove, wherein at least a part of the dicing film exposed around the outer periphery of the wafer is sucked into the groove and suspended while operating together with a suction of the wafer to the groove and the suspension thereof by the holding means.

2. The wafer table according to claim 1, wherein the grooves are formed in such a manner that when the wafer is held by the adsorption means, a bisector of a corner portion of a circuit pattern formed on the wafer is parallel to a line segment connecting a center of the grooves and a center of the wafer.

3. The wafer table according to claim 1, wherein side surfaces of the grooves in a section of the grooves are formed in an acute angle with respect to the surface of the table.

4. The wafer table according to claim 1, wherein the suction means includes at least one conduction hole extending from the grooves to the adsorption means.

5. The wafer table according to claim 1, wherein an inner side portion of each of the grooves is in the shape of an arc corresponding to at least a part of the outer periphery of the wafer and an outer side portion of each of the grooves is in an arbitrary shape including a linear form on an inside of the mount frame.

6. The wafer table according to claim 1, wherein the first groove is formed in a manner that one of two transverse edges of the peeling tape is located in the first groove, and the other of two transverse edges of the peeling tape is located in the second groove.

7. A surface protective film peeling apparatus for peeling off a surface protective film of a wafer having a back surface supported on a mount frame via a dicing film and a front surface with the surface protective film attached thereon, comprising:
    a wafer table according to claim 1 for adsorbing the wafer with the front surface of the wafer facing upward;
    a peeling tape supply means for supplying a peeling tape onto the surface protective film attached on the front surface of the wafer;
    a press means for pressing only a part of the peeling tape against the surface protective film of the wafer to increase adherence between the peeling tape and the surface protective film at said only a of the peeling tape; and
    a peeling means for peeling off the surface protective film from the front surface of the wafer by the peeling tape using said only a of the peeling tape having the increased adherence as a peeling start point.

8. The surface protective film peeling apparatus according to claim 7,
    wherein the press means includes a press roller to move substantially transversely of the peeling tape; and
    wherein said only a of the peeling tape is pressed by the press roller moving on said only a of the peeling tape.

9. The surface protective film peeling apparatus according to claim 8,
    wherein the press means includes a rotatable disk and the press roller is mounted on a lower surface of the rotatable disk in such a manner that a rotation axis of the press roller is located on a radius of the rotatable disk, and
    wherein the press roller is rotated along an arc on the peeling tape at a time of rotation of the rotatable disk.

10. The surface protective film peeling apparatus according to claim 9, wherein an auxiliary roller is mounted on the lower surface of the rotatable disk and presses the surface protective film of the wafer located at a position other than the peeling tape.

11. The surface protective film peeling apparatus according to claim 10, wherein positions of the press roller and the auxiliary roller can be adjusted in a radial direction on the lower surface of the rotatable disk.

12. A surface protective film peeling method for peeling off a wafer having a back surface supported on a mount frame via a dicing film and a front surface with a surface protective film attached thereon, comprising:
    arranging the wafer on a wafer table according to claim 1 with the front surface of the wafer facing upward;
    supplying a peeling tape onto the surface protective film attached on the front surface of the wafer;
    pressing a part of the peeling tape against the surface protective film of the wafer using a press means thereby to increase the adherence between the peeling tape and the surface protective film at the part of the peeling tape; and
    peeling off the surface protective film from the front surface of the wafer by the peeling tape using the part of the peeling tape having the increased adherence as a peeling start point.

13. A wafer table for adsorbing a wafer having a back surface supported on a mount frame via a dicing film and a front surface with a surface protective film attached thereon, the surface protective film having a peeling tape attached thereon, comprising:
    a holding member for holding the wafer to a surface of the table;
    a first groove and a second groove formed in an area of the table corresponding to at least a part of an outer periphery of the wafer, wherein the first groove is formed in the area covering only one transverse edge of the peeling tape, and a second groove formed in the area covering only the other transverse edge of the peeling tape, wherein a distance between the first groove and a center of the table is equal to a distance between the second grove and the center of the table; and
    a vacuum source for sucking the air in the groove, wherein at least a part of the dicing film exposed around the outer periphery of the wafer is sucked into the groove and suspended while operating together with a suction of the wafer to the groove and the suspension thereof by the holding member.

* * * * *

UNITED STATES PATENT AND TRADEMARK OFFICE
CERTIFICATE OF CORRECTION

PATENT NO. : 8,182,632 B2
APPLICATION NO. : 12/664870
DATED : May 22, 2012
INVENTOR(S) : Hideo Kino et al.

Page 1 of 1

It is certified that error appears in the above-identified patent and that said Letters Patent is hereby corrected as shown below:

In the Claims

| | |
|---|---|
| Column 13, line 21, Claim 1 | Delete "grove", Insert --groove-- |
| Column 13, line 66, Claim 7 | After "only a", Insert --part-- |
| Column 14, line 3, Claim 7 | After "only a", Insert --part-- |
| Column 14, line 9, Claim 8 | After "only a", Insert --part-- |
| Column 14, line 10, Claim 8 | After "only a", Insert --part-- |
| Column 14, line 59, Claim 13 | Delete "grove", Insert --groove-- |

Signed and Sealed this
Twenty-fifth Day of September, 2012

David J. Kappos
*Director of the United States Patent and Trademark Office*